(12) United States Patent
Song

(10) Patent No.: US 12,324,308 B2
(45) Date of Patent: *Jun. 3, 2025

(54) ORGANIC LIGHT EMITTING DISPLAY DEVICE HAVING A RESONANCE STRUCTURE OF PROPER INTERNAL REFLECTION BY INCLUDING A LIGHT EXTRACTION REDUCTION PREVENTING LAYER

(71) Applicant: Samsung Display Co., Ltd., Yongin-si (KR)

(72) Inventor: Seung-Yong Song, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/407,279

(22) Filed: Jan. 8, 2024

(65) Prior Publication Data

US 2024/0237395 A1    Jul. 11, 2024

Related U.S. Application Data

(63) Continuation of application No. 17/827,761, filed on May 29, 2022, now Pat. No. 11,871,613, which is a
(Continued)

(30) Foreign Application Priority Data

Nov. 20, 2012  (KR) .................. 10-2012-0131598

(51) Int. Cl.
   *H01L 51/52*     (2006.01)
   *H10K 50/842*    (2023.01)
(Continued)

(52) U.S. Cl.
   CPC ....... *H10K 50/858* (2023.02); *H10K 50/8426* (2023.02); *H10K 50/844* (2023.02); *H10K 50/85* (2023.02); *H10K 71/00* (2023.02)

(58) Field of Classification Search
   CPC .. H10K 50/85; H10K 50/844; H10K 59/8731; H10K 50/8426
   (Continued)

(56) References Cited

U.S. PATENT DOCUMENTS 8,389,983 B2    3/2013  Seo et al.
9,431,634 B2    8/2016  Song
(Continued)

FOREIGN PATENT DOCUMENTS

JP    2011-521423    7/2011
JP    2012-017448    1/2012
(Continued)

OTHER PUBLICATIONS

Notice of Allowance dated Oct. 24, 2018, in U.S. Appl. No. 15/227,830.
(Continued)

*Primary Examiner* — Didarul A Mazumder
(74) *Attorney, Agent, or Firm* — CANTOR COLBURN LLP

(57) ABSTRACT

An organic light emitting display device including a light extraction reduction preventing layer disposed between a display unit disposed on a substrate and an encapsulation layer for protecting the display unit, which improves light emission efficiency by reducing an amount of light dissipating while light generated from an emission layer of the display unit is extracted to the outside.

11 Claims, 4 Drawing Sheets

Related U.S. Application Data continuation of application No. 17/105,289, filed on Nov. 25, 2020, now Pat. No. 11,349,101, which is a continuation of application No. 16/284,781, filed on Feb. 25, 2019, now Pat. No. 10,879,494, which is a continuation of application No. 15/227,830, filed on Aug. 3, 2016, now Pat. No. 10,236,474, which is a continuation of application No. 13/832,742, filed on Mar. 15, 2013, now Pat. No. 9,431,634.

(51) Int. Cl.
*H10K 50/844* (2023.01)
*H10K 50/85* (2023.01)
*H10K 50/858* (2023.01)
*H10K 71/00* (2023.01)

(58) Field of Classification Search
USPC .................................. 257/40; 438/82, 99
See application file for complete search history.

(56) References Cited

U.S. PATENT DOCUMENTS

| | | | |
|---|---|---|---|
| 10,879,494 B2 * | 12/2020 | Song | H10K 59/879 |
| 2002/0070663 A1 | 6/2002 | Ogura et al. | |
| 2003/0048072 A1 | 3/2003 | Ishihara et al. | |
| 2007/0114925 A1 | 5/2007 | Cok | |
| 2008/0006819 A1 | 1/2008 | McCormick et al. | |
| 2008/0142789 A1 | 6/2008 | Suganuma | |
| 2009/0267487 A1 | 10/2009 | Kwack et al. | |
| 2010/0001301 A1 | 1/2010 | Karg et al. | |
| 2010/0084677 A1 | 4/2010 | Michellys | |
| 2010/0181903 A1 | 7/2010 | Kim et al. | |
| 2011/0031479 A1 | 2/2011 | Ryu et al. | |
| 2011/0073897 A1 | 3/2011 | Kang et al. | |
| 2011/0163330 A1 | 7/2011 | Kim et al. | |
| 2011/0163339 A1 | 7/2011 | Negishi et al. | |
| 2012/0133275 A1 | 5/2012 | Lee et al. | |
| 2012/0138918 A1 | 6/2012 | Naraoka et al. | |
| 2012/0146492 A1 | 6/2012 | Ryu et al. | |
| 2012/0228601 A1 | 9/2012 | Hiyama et al. | |
| 2012/0228668 A1 | 9/2012 | Thoumazet et al. | |
| 2012/0248422 A1 | 10/2012 | Mine et al. | |
| 2012/0256218 A1 | 10/2012 | Kwack et al. | |
| 2012/0261701 A1 | 10/2012 | Yoo et al. | |
| 2012/0286255 A1 | 11/2012 | Tanaka | |
| 2013/0037792 A1 | 2/2013 | Kim et al. | |
| 2013/0056717 A1 | 3/2013 | Ishihara et al. | |
| 2013/0103123 A1 | 4/2013 | Khan et al. | |
| 2013/0168644 A1 | 7/2013 | Park | |
| 2013/0193419 A1 | 8/2013 | Mizuno | |
| 2014/0070187 A1 | 3/2014 | Cho et al. | |

FOREIGN PATENT DOCUMENTS

| | | |
|---|---|---|
| KR | 10-2008-0048216 | 6/2008 |
| KR | 10-2009-0112387 | 10/2009 |
| KR | 10-2009-0132025 | 12/2009 |
| KR | 10-2010-0085347 | 7/2010 |
| KR | 10-2011-0035791 | 4/2011 |
| KR | 10-2011-0080050 | 7/2011 |
| KR | 10-2011-0135045 | 12/2011 |
| KR | 10-2012-0057286 | 6/2012 |
| KR | 10-2012-0118306 | 10/2012 |
| KR | 10-2014-0033867 | 3/2014 |

OTHER PUBLICATIONS

Non-Final Office Action dated Apr. 2, 2018, in U.S. Appl. No. 15/227,830.
Final Office Action dated Oct. 20, 2017, in U.S. Appl. No. 15/227,830.
Non-Final Office Action dated Apr. 13, 2017, in U.S. Appl. No. 15/227,830.
Notice of Allowance dated May 3, 2016, in U.S. Appl. No. 13/832,742.
Non-Final Office Action dated Jan. 11, 2016, in U.S. Appl. No. 13/832,742.
Final Office Action dated May 22, 2015, in U.S. Appl. No. 13/832,742.
Non-Final Office Action dated Oct. 9, 2014, in U.S. Appl. No. 13/832,742.
Non-Final Office Action dated Feb. 14, 2014, in U.S. Appl. No. 13/832,742.
Awazu et al., "A Plasmonic Photocatalyst Consisting of Silver Nanoparticles Embedded in Titanium Dioxide," J. Am. Chem. Soc., Jan. 12, 2008, pp. 1676-1680, vol. 130, Issue 5, Am. Chem. Soc.
Office Action dated Dec. 12, 2013, in Korean Patent Application No. 10-2012-0131598.
Final Office Action dated May 19, 2014, in Korean Patent Application No. 10-2012-0131598.
Decision to Grant Patent dated Dec. 12, 2014, in Korean Patent Application No. 10-2012-0131598.
Non-Final Office Action dated Sep. 26, 2019, issued to U.S. Appl. No. 16/284,781.
Final Office Action dated Feb. 26, 2020, issued to U.S. Appl. No. 16/284,781.
Non-Final Office Action dated May 27, 2020, issued to U.S. Appl. No. 16/284,781.
Notice of Allowance dated Aug. 27, 2020, issued to U.S. Appl. No. 16/284,781.
Non-Final Office Action dated Oct. 1, 2021, issued to U.S. Appl. No. 17/105,289.
Notice of Allowance dated Feb. 1, 2022, issued to U.S. Appl. No. 17/105,289.
Notice of Allowance dated Feb. 15, 2022, issued to U.S. Appl. No. 17/105,289.
Non-Final Office Action dated Feb. 24, 2023, issued to U.S. Appl. No. 17/827,761.
Notice of Allowance dated Aug. 31, 2023, issued to U.S. Appl. No. 17/827,761.

* cited by examiner

ORGANIC LIGHT EMITTING DISPLAY DEVICE HAVING A RESONANCE STRUCTURE OF PROPER INTERNAL REFLECTION BY INCLUDING A LIGHT EXTRACTION REDUCTION PREVENTING LAYER

CROSS-REFERENCE TO RELATED APPLICATIONS

This application is a continuation of U.S. patent application Ser. No. 17/827,761, field on May 29, 2022, which is a continuation of U.S. patent application Ser. No. 17/105,289, filed on Nov. 25, 2020, now U.S. Pat. No. 11,349,101, issued on May 31, 2022, which is a continuation of U.S. patent application Ser. No. 16/284,781, filed on Feb. 25, 2019, now U.S. Pat. No. 10,879,494, issued on Dec. 29, 2020, which is a continuation of U.S. patent application Ser. No. 15/227,830, filed on Aug. 3, 2016, now U.S. Pat. No. 10,236,474, which is a continuation of U.S. patent application Ser. No. 13/832,742, filed Apr. 20, 2015, now U.S. Pat. No. 9,431,634, issued on Aug. 30, 2016, which claims priority to and the benefit of Korean Patent Application No. 10-2012-0131598, filed on Nov. 20, 2012, with the Korean Intellectual Property Office, the entire contents of all of which are incorporated herein by reference.

BACKGROUND OF THE INVENTION

Field of the Invention

The present disclosure relates to an organic light emitting display device, and, more particularly, to an organic light emitting display device improving light emitting efficiency by reducing an amount of light that dissipates while the light generated from an emission layer is discharged to the outside environment.

Description of the Related Art

An organic light emitting display device is a self-emission display device which has an organic light emitting diode that emits light to display an image. Since the organic light emitting display device has characteristics such as low power consumption, high luminance, and a high response speed, the organic light emitting display device currently receives attention as a display device.

In general, in the organic light emitting display device, a portion of the device generating light is called a display unit, and the display unit includes a hole injection electrode, an emission layer, and an electron injection electrode. In the organic light emitting display device, holes supplied from the hole injection electrode and electrons supplied from the electron injection electrode are coupled with each other in the emission layer to generate light. Generally, the hole injection electrode is an anode, and the electron injection electrode is a cathode.

However, the display unit can be easily damaged by an external gas such as oxygen or moisture, and the display unit may deteriorate due to contact with oxygen or moisture. Accordingly, in order to prevent oxygen or moisture from penetrating from the outside, an encapsulation structure for sealing and protecting the display unit is required.

As an example of such an encapsulation structure, an encapsulation layer, specifically a thin film encapsulation layer, in which inorganic layers and organic layers are alternately laminated is adopted. That is, the encapsulation layer, in which inorganic layers and organic layers are alternately laminated, is formed on the display unit, which is formed on a substrate to seal the display unit and thus protect the display unit. Here, the organic layer mainly functions to give flexibility to a flat panel display, and the inorganic layer mainly serves to prevent oxygen or moisture from penetrating into the device.

However, when the light generated from the emission layer is discharged to the outside environment, a large amount of light dissipates while passing through a laminated structure such as the encapsulation layer disposed on the emission layer. The light efficiency of the organic light emitting display device is not good because the light dissipates. Accordingly, in order to increase the light efficiency in the organic light emitting display device, dissipation of the light needs to be minimized.

SUMMARY OF THE INVENTION

The present disclosure has been made in an effort to provide an organic light emitting display device having improved light extraction efficiency by properly controlling a refractive index difference between a display unit and an encapsulation layer to properly establish a resonance condition.

Further, the present disclosure has been made in an effort to provide an organic light emitting display device including a light efficiency reduction preventing layer between the display unit and the encapsulation layer.

An embodiment of the present disclosure provides an organic light emitting display device, including: a substrate; a display unit disposed on the substrate; a light extraction reduction preventing layer disposed on the display unit; and an encapsulation layer disposed on the light extraction reduction preventing layer.

The encapsulation layer may have a structure in which a plurality of inorganic layers and a plurality of organic layers are alternately laminated.

A thickness of the organic layers may be larger than a thickness of the inorganic layers.

A refractive index of the encapsulation layer may be in the range of from about 1.5 to about 2.0.

A capping layer may be disposed between the display unit and the light extraction reduction preventing layer.

A thickness of the capping layer may be in the range of from about 20 nm to about 200 nm.

The capping layer may comprise at least one selected from a group consisting of tris(8-hydroxyquinolinato)aluminum (Alq3), ZnSe, 2,5-bis(6'-(2',2''-bipyridyl))-1,1-dimethyl-3,4-diphenylsilole, 4,4'-bis[N-(1-naphthyl)-N-phenyl-amino]biphenyl (α-NPD), N,N'-diphenyl-N,N'-bis(3-methylphenyl)-1,1'-biphenyl-4,4'-diamine (TPD), and 1,1-bis[di-(4-tolylamino)phenyl]cyclohexane (TAPC).

A refractive index of the capping layer may be in the range of from about 1.6 to about 3.0.

A refractive index of the light extraction reduction preventing layer may be in the range of from about 1.1 to less than about 1.5.

The light extraction reduction preventing layer may comprise at least one selected from $CaF_2$, NaF, $Na_3AlF_6$, SiOx, $AlF_3$, LiF, $MgF_2$, and $IF_3$.

A thickness of the light extraction reduction preventing layer may be in the range of from about 20 nm to about 200 nm.

The display unit may include a first electrode formed on the substrate; an emission layer formed on the first electrode; and a second electrode formed on the emission layer.

Another embodiment of the present disclosure provides a manufacturing method of an organic light emitting display device, including: forming a display unit on a substrate; forming a light extraction reduction preventing layer on the display unit; and forming an encapsulation layer on the light extraction reduction preventing layer.

The manufacturing method of an organic light emitting display device may further include forming a capping layer before the forming of the light extraction reduction preventing layer and after the forming of the display unit.

In the forming of the encapsulation layer, laminating inorganic layers and laminating organic layers may be alternately performed one or more times.

A refractive index of the capping layer may be in the range of from about 1.6 to about 3.0.

A refractive index of the light extraction reduction preventing layer may be in the range of from about 1.1 or more to less than about 1.5.

Yet another embodiment of the present disclosure provides an organic light emitting display device, including: a substrate; a first electrode disposed on the substrate; an emission layer disposed on the first electrode; a second electrode formed on the emission layer; a capping layer disposed on the second electrode; a light extraction reduction preventing layer disposed on the capping layer; and an encapsulation layer disposed on the light extraction reduction preventing layer, in which a refractive index of the light extraction reduction preventing layer is lower than a refractive index of the capping layer and lower than a refractive index of the encapsulation layer.

According to an embodiment of the present disclosure, a light extraction reduction preventing layer is disposed between a display unit and an encapsulation layer, and thus while light generated from an emission layer is discharged to the outside environment, resonance efficiently occurs reducing light dissipation, thereby improving light emission efficiency of the organic light emitting display device. Particularly, in the case where a capping layer having a high refractive index is disposed on the display unit, the light extraction reduction preventing layer is disposed between the capping layer and the encapsulation layer and thus a difference in a refractive index between the capping layer and the encapsulation layer occurs, and as a result, a resonance condition can be efficiently established during a light extraction process. As a result, it is possible to improve light emission efficiency by improving light extraction efficiency.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
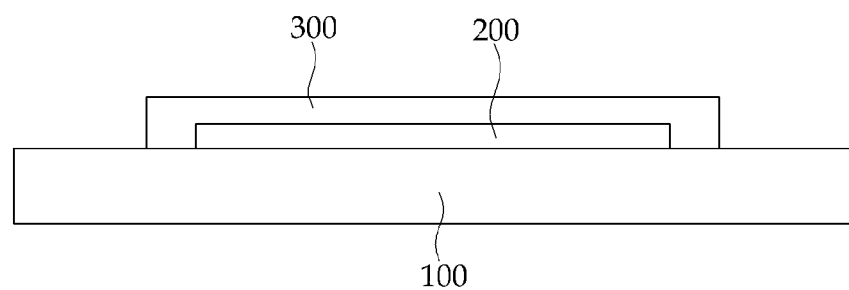
FIG. 1 is a schematic diagram of an example of an organic light emitting display device.

Hereinafter, embodiments of the present disclosure will be described in more detail with reference to the accompanying drawings. However, the scope of the present disclosure is not limited to the following Examples and drawings. Embodiments to be described below and illustrated in the drawings may include various equivalents and modifications.

The terminology used in this specification is used in order to express the embodiments of the present disclosure and may depend on the intention of users or operators or the custom in the art to which the present disclosure belongs. Accordingly, the terminology needs to be defined base on the details provided throughout this specification.

For reference, respective components and shapes thereof are schematically drawn or exaggeratedly drawn in the accompanying drawings for easy understanding. Like reference numerals designate like elements throughout the drawings.

Further, it will be understood that when a layer or an element is described as being "on" another layer or element, it may be directly disposed on another layer or element, or an intervening layer or element may also be present therebetween.

FIG. 1 illustrates an example of a structure of an organic light emitting display device. The organic light emitting display device illustrated in FIG. 1 includes a substrate 100, a display unit 200 disposed on the substrate 100, and an encapsulation layer 300 disposed on the display unit 200. In a thin organic light emitting display device or a flexible organic light emitting display device, the display unit 200 is protected by using the encapsulation layer 300.

Figure 2:
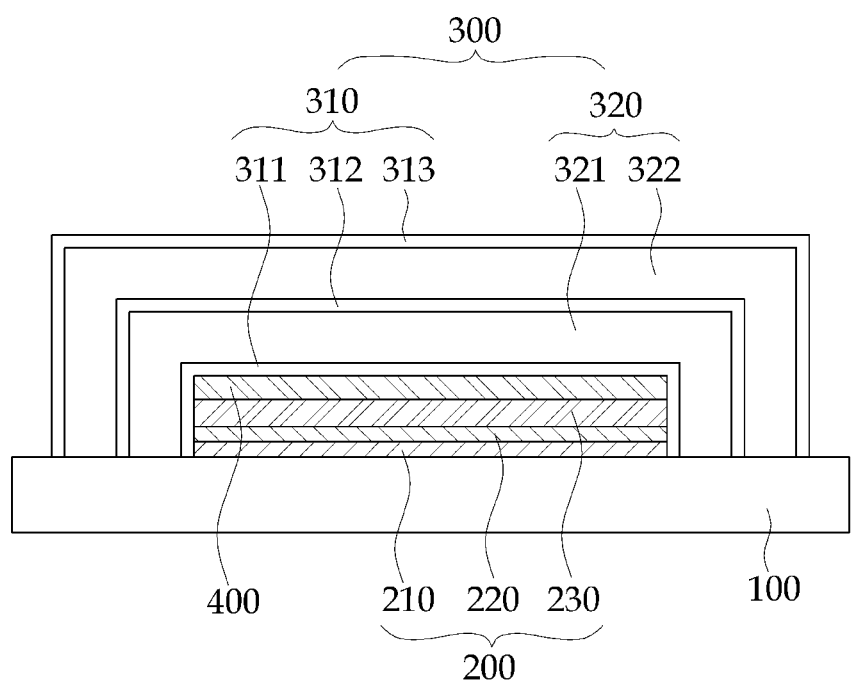
FIG. 2 is a schematic diagram of an example of a laminated structure in the organic light emitting display device.

FIG. 2 illustrates a structure of the organic light emitting display device of one embodiment of the invention in more detail.

In the organic light emitting display device, a portion generating light is called the display unit 200, and the display unit 200 includes a first electrode 210, an emission layer 220, and a second electrode 230.

The first electrode 210 may be a hole injection electrode, and the second electrode 230 may be an electron injection electrode. Holes supplied from the first electrode 210 and electrons supplied from the second electrode 230 are coupled with each other in the emission layer 220 to generate light.

Alternatively, the first electrode 210 may be an electron injection electrode, and the second electrode 230 may be a hole injection electrode. Electrons supplied from the first electrode 210 and holes supplied from the second electrode 230 are coupled with each other in the emission layer 220 to generate light.

However, the display unit 200 is very vulnerable to intrusion of external gas such as oxygen or moisture. Accordingly, in order to prevent oxygen or moisture from penetrating from the outside, the encapsulation layer 300 may be disposed as a seal around the display unit 200. Further, in order to protect the display unit 200 before forming the encapsulation layer 300 and prevent the display unit 200 from being damaged while forming the encapsulation layer 300, a capping layer 400 may be disposed on the display unit 200 before the encapsulation layer 300 is put in place.

In FIG. 2, the encapsulation layer 300 as a thin film encapsulation layer in which inorganic layers 310 and organic layers 320 are alternately laminated is illustrated. The inorganic layers 310 and organic layers 320, which are alternately laminated, form the encapsulation layer 300. That is, a plurality of inorganic layers 311, 312, and 313 and a plurality of organic layers 321 and 322 are alternately laminated on the display unit 200 to seal the display unit 200. Here, the organic layers 320 may mainly function to give flexibility to a flat panel display, and the inorganic layers 310 may mainly serve to prevent oxygen or moisture from penetrating.

In FIG. 2, three inorganic layers 311, 312, and 313 and two organic layers 321 and 322 are shown alternately laminated each other to cover the emission layer 200 on the substrate 100.

The inorganic layer 310 may be made of metal oxide or metal nitride by a method such as, for example, one of sputtering, chemical vapor deposition (CVD), ion beam assisted deposition (IBAD), and the like.

Further, the organic layer 320 may be formed, for example, by depositing a liquefied or evaporated monomer and then irradiating the monomer coating with ultraviolet light to cure the deposited material. Acceptable methods of forming the organic layer 320 are not limited to the exemplary methods specifically described herein.

A capping layer 400 may be disposed between the encapsulation layer 300 and the display unit 200.

As an example of the capping layer 400, an ultraviolet blocking layer capable of blocking ultraviolet light that can have a bad influence on the display unit 200 may be formed. For example, ultraviolet light may be irradiated onto an organic precursor or monomer coating in order to form the organic layer 320 while the encapsulation layer 300 is formed. In this case, in order to prevent the display unit 200 from being damaged by the ultraviolet light, a capping layer 400 having an ultraviolet blocking characteristic may be formed on the display unit 200. The capping layer 400 may be formed by a single layer or may be formed by a multilayer with two or more layers. The capping layer 400 may have a moisture or oxygen blocking characteristic.

Figure 3:
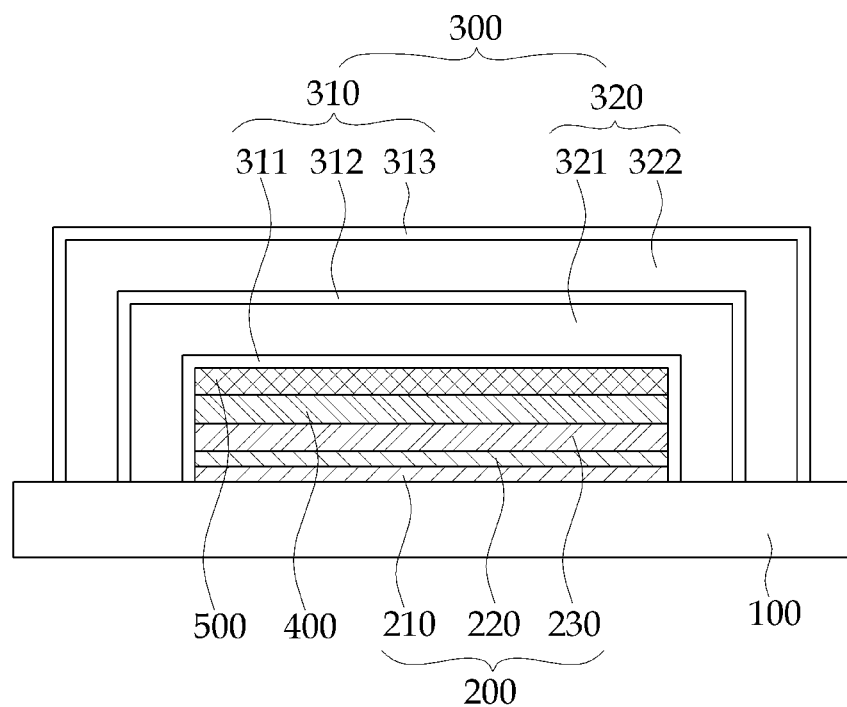
FIG. 3 is a diagram for describing a structure of an organic light emitting display device according to an embodiment of the present disclosure.

FIG. 3 illustrates a structure of an organic light emitting display device according to an embodiment of the present disclosure.

The organic light emitting display device illustrated in FIG. 3 includes a substrate 100, a display unit 200 disposed on the substrate 100, a light extraction reduction preventing layer 500 disposed on the display unit 200, and an encapsulation layer 300 disposed on the light extraction reduction preventing layer 500. Further, in the organic light emitting display device illustrated in FIG. 3, a capping layer 400 is disposed between the display unit 200 and the light extraction reduction preventing layer 500.

In detail, the display unit 200 may be formed on the substrate 100, and the display unit may include a first electrode 210 formed on the substrate 100, an emission layer 220 formed on the first electrode 210, and a second electrode 230 formed on the emission layer 220.

Although not illustrated in FIG. 3, at least one of a hole injection layer and a hole transport layer may be disposed between the first electrode 210 and the emission layer 220. Similarly, although not illustrated in FIG. 3, at least one of an electron transport layer and an electron injection layer may be disposed between the emission layer 220 and the second electrode 230.

The encapsulation layer 300 is disposed to cover display unit 200 in order to protect the display unit 200. In order to form the encapsulation layer 300, the inorganic layers 310 and the organic layers 320 are alternately laminated.

In detail, first, the first inorganic layer 311 is coated to cover the display unit 200, a first organic layer 321 is coated thereon, a second inorganic layer 312 and a second organic layer 322 are coated thereon, and then an inorganic layer 313 is finally coated on the top organic layer to form the encapsulation layer 300.

In the illustration of FIG. 3, three inorganic layers 310 and two organic layers 320 are formed, but the inorganic layers 310 and the organic layers 320 may be alternately coated two additional times or more. If necessary, the inorganic layers 310 and the organic layers 320 may be alternately coated thirty times, or more than thirty times. A thickness of the encapsulation layer 300 may depend on the laminated number of inorganic layers 310 and organic layers 320. The thickness of the encapsulation layer 300 may be properly controlled if necessary.

In the encapsulation layer 300 in FIG. 3, it is exemplified that both the first layer disposed to be closest to the display unit 200 while covering the display unit 200 and the last layer disposed at the outermost side of the encapsulation layer 300 while being farthest away from the display unit 200 are formed as the inorganic layers 310. In the other cases, the first layer disposed to be closest to the display unit 200 and the outermost layer disposed to be farthest away from the display unit 200 may not be formed as inorganic layers 310.

The inorganic layer 310 may be made of metal oxide or metal nitride by, for example, a method such as one of sputtering, CVD, ion beam assisted deposition (IBAD), and the like. The inorganic layer may be formed by using a material selected from, for example, calcium oxide, alumina, silica, titania, indium oxide, tin oxide, silicon oxide, silicon nitride, and aluminum nitride, and the material is not necessarily limited to the examples presented herein.

The organic layers 320 may be formed by depositing a liquefied or evaporated monomer and then irradiating ultraviolet light to cure the deposited material. The organic layer material may include, for example, any one selected from acrylic, metacrylic, polyester, poly(ethylene terephthalate) (PET), polyethylene, and polypropylene or a mixture thereof, and is not necessarily limited to the examples.

A refractive index of the encapsulation layer 300 including the inorganic layers 310 and the organic layers 320 which are formed as described above may have a value in the range of from about 1.5 to about 2.0. Even though the encapsulation layer 300 in different embodiments of the invention may be formed by using the same material, the value of the refractive index may vary depending on a method of forming the encapsulation layer 300. In the case where the encapsulation layer 300 is formed by using the above materials using a method which is generally used in the art, the refractive index of the encapsulation layer 300 may be in the range of from about 1.5 to about 2.0.

In the embodiment illustrated in FIG. 3, the encapsulation layer 300 is formed in different thicknesses of the inorganic layer 310 and the organic layer 320. Considering the inorganic layer 310 and the organic layer 320, a thickness of each organic layer 320 is set to be larger than a thickness of each inorganic layer 310. For example, the thickness of each organic layer 320 may be about 2 to 5 times larger than the thickness of each inorganic layer 310. Further, as illustrated in FIG. 3, respective ends of the inorganic layer 310 and the organic layer 320 may have a structure directly contacting the substrate.

Here, the thickness of the inorganic layers 311, 312, and 313 may be set in the range of from about 10 nm to about 50 nm respectively, and the thickness of the organic layers 321 and 322 may be set in the range of from about 20 nm to about 200 nm respectively. In another embodiment of the present disclosure, the thickness of each layer of the inorganic layers 310 is set to about 100 nm and the thickness of each layer of the organic layers 320 is set to about 500 nm to form the encapsulation layer 300.

Further, in order to prevent the display unit 200 from being damaged while forming the encapsulation layer 300, a capping layer 400 may be disposed on the display unit 200 before the encapsulation layer is disposed on the capping layer 400.

That is, as illustrated in FIG. 3, the capping layer 400 may be formed between the encapsulation layer 300 and the display unit 200.

As an example of the capping layer 400, the capping layer 400 may be formed as an ultraviolet blocking layer capable of blocking ultraviolet light that can negatively influence the display unit 200. That is, in some cases, in order to form the organic layer 320 while forming the encapsulation layer 300, the ultraviolet light is irradiated. In this case, in order to prevent the display unit 200 from being damaged by the ultraviolet light, the capping layer 400 having an ultraviolet blocking characteristic may be formed on the display unit 200. The capping layer 400 may be formed in a single layer or may be formed as a multilayer with two or more layers.

To this end, the capping layer 400 may be made of a transparent material having an ultraviolet blocking characteristic. As the material, a material reflecting or absorbing ultraviolet light is included. As the capping layer 400, a material having a characteristic of blocking moisture, air, or oxygen may be used.

The thickness of the capping layer 400 may be controlled to satisfy the following Formula.

$$n \cdot d = \lambda/4$$

Here, n is a refractive index, d is a thickness, and $\lambda$ is a center value of an emission wavelength band. Here, the emission wavelength is a visible light emission wavelength, and a wavelength $\lambda$ may depend on a use thereof, in the case of being applied as a use for emitting specific color light.

In the case of considering an ultraviolet blocking characteristic, the thickness of the capping layer 400 may be set in the range of from about 20 to about 200 nm. When the thickness of the capping layer 400 is less than about 20 nm, the ultraviolet light is not easily blocked, and thus display unit 200 may be damaged due to exposure to the ultraviolet light, and when the thickness is more than about 200 nm, a light extraction ratio or a color purity characteristic of the organic light emitting display device may deteriorate.

According to an embodiment of the present disclosure, the capping layer 400 may comprise at least one material selected from tris(8-hydroxyquinolinato)aluminum (Alq3), ZnSe, 2,5-bis(6'-(2',2"-bipyridyl))-1,1-dimethyl-3,4-diphenylsilole, 4,4'-bis[N-(1-naphthyl)-N-phenyl-amino]biphenyl (α-NPD), N,N'-diphenyl-N,N'-bis(3-methylphenyl)-1,1'-biphenyl-4,4'-diamine (TPD), 1,1'-bis[di-(4-tolylamino)phenyl]cyclohexane (TAPC).

When the capping layer 400 is formed by using one of these materials, the refractive index of the capping layer 400 may be in the range of about 1.6 or more.

As the refractive index of the capping layer 400 is increased, the capping layer 400 can be made thinner. That is, in the Formula, in a relationship of n·d=λ/4, as a refractive index n is increased, a thickness d may be decreased, and as a result, as the n is increased, it is advantageous to slim the device. However, it is not easy to increase the refractive index of the capping layer 400 without limit because it must be matched with other desirable characteristics of the capping layer material. Accordingly, considering the refractive index of the display unit 200 and the refractive index of the encapsulation layer 300, the refractive index of the capping layer 400 may desirably be in the range of from about 1.6 to about 3.0.

When considering thicknesses of other constituent elements of the organic light emitting display device in addition to that of the encapsulation layer 300, an efficiency characteristic of the organic light emitting display device and the refractive index of the capping layer material, a condition of n·d=λ/4 may be satisfied if the thickness of the capping layer 400 is in the range from about 50 to about 150 nm.

Since the organic light emitting display device is formed in a multilayer laminated structure, light generated from the emission layer 220 must pass through the laminated structure disposed above the emission layer 220 before being discharged to the outside. However, as the light generated from the emission layer 220 passes through the laminated structure disposed above the emission layer 220, a large amount of light may dissipate. Light extraction efficiency of the organic light emitting display device is not good because the light dissipates.

An important factor among factors in explaining the dissipation of light as it passes through the multilayered structure is total reflection. In order to prevent the light from dissipating due to total reflection while light is being discharged to the outside, a structure that can induce a proper reflection on the interface of the multilayered laminated structure, thereby preventing a total reflection on the interface, may be adopted. Such a structure, designed to make proper reflection on the interface between the layers in order to increase light extraction efficiency as light generated from the emission layer 220 is discharged to the outside, is called a resonance structure. In this embodiment of the invention, in order to reduce the amount of light dissipating while light generated from the emission layer 220 is discharged to the outside, the resonance structure is constructed.

In order to improve extraction of light using a resonance structure, the proper reflection needs to be arranged. However, in the case where the refractive index difference between the display unit 200 and the encapsulation layer 300 is not large enough, minimal reflection occurs on the interface, and the resonance condition is not optimally established.

Further, when the capping layer 400 is disposed on the display unit 200, in the case where a difference in a refractive index between the capping layer 400 and the encapsulation layer 300 is not large, the reflection on the interface does not easily occur, and the resonance condition is not optimally established. For slimness of the device, it is advantageous that the capping layer 400 be made of a high refractive index material. Regarding the encapsulation layer 300, in order to prevent primary penetration of moisture, the first component layer of the encapsulation layer 300, the one adjacent to the capping layer 400, may be formed as an inorganic layer 311 having a high refractive index. In this case, since the refractive index of the inorganic layer 311 is high, the difference in a refractive index between the capping layer 400 and the inorganic layer 311 is not large and thus the resonance condition may not be established well.

Considering this, in an embodiment of the present disclosure, the light extraction reduction preventing layer 500, having a low refractive index, is disposed between the display unit 200 and the encapsulation layer 300 in order to improve light extraction efficiency. In detail, since the light extraction reduction preventing (or first) layer 500 is disposed between the display unit 200 and the encapsulation layer 300, a low refractive index layer is disposed between the display unit 200 and the encapsulation layer 300 and thus a difference in a refractive index between the layers occurs that may facilitate the establishment of a desired resonance condition.

Further, when the capping layer 400 is disposed on the display unit 200, the light extraction reduction preventing layer 500, having a low refractive index, is disposed between the capping layer 400 and the encapsulation layer 300, and, as a result, the difference in refractive index between the layers occurs and improves light extraction efficiency.

In FIG. 3, the capping layer 400 is disposed on the display unit 200, the light extraction reduction preventing layer 500 is disposed on the capping layer 400, and the encapsulation layer 300 is disposed on the light extraction reduction preventing layer 500. A portion of encapsulation layer 300 contacting the light extraction reduction preventing layer 500 is formed as the inorganic layer 311.

The light extraction reduction preventing layer 500 may be made of a light transmitting material, and it is advantageous if the refractive index of the light extraction reduction preventing layer 500 is very different from the refractive indexes of the capping layer 400 and the encapsulation layer 300. In general, when considering that a refractive index of a transparent solid material is 1.1 or more and the refractive indexes of the capping layer 400 and the encapsulation layer 300 are 1.5 or more, the refractive index of the light extraction reduction preventing layer 500 may advantageously be controlled to 1.1 or more to less than 1.5.

Considering that readily available options exist for selecting a low refractive index transparent solid material and the difference in refractive index between that low refractive index material and adjacent layers including the capping layer 400 and the encapsulation layer 300, the refractive index of the light extraction reduction preventing layer 500 may advantageously be controlled to be in a range of from about 1.2 to about 1.4.

When considering the difference in the refractive index of the light extraction reduction preventing layer 500 compared to those of the capping layer 400 and the encapsulation layer 300 and considering the need for transparency of the material, the light extraction reduction preventing layer 500 may comprise at least one of $CaF_2$, NaF, $Na_3AlF_6$, $SiO_x$, $AlF_3$, LiF, $MgF_2$, and $IF_3$.

Meanwhile, in order to form the resonance structure, the light extraction reduction preventing layer 500 may also be formed to satisfy the condition of the Formula, that is, $n \cdot d = \lambda/4$. When considering the details, the thickness of the light extraction reduction preventing layer 500 may be set in the range of from about 20 nm to about 200 nm.

Figure 4:
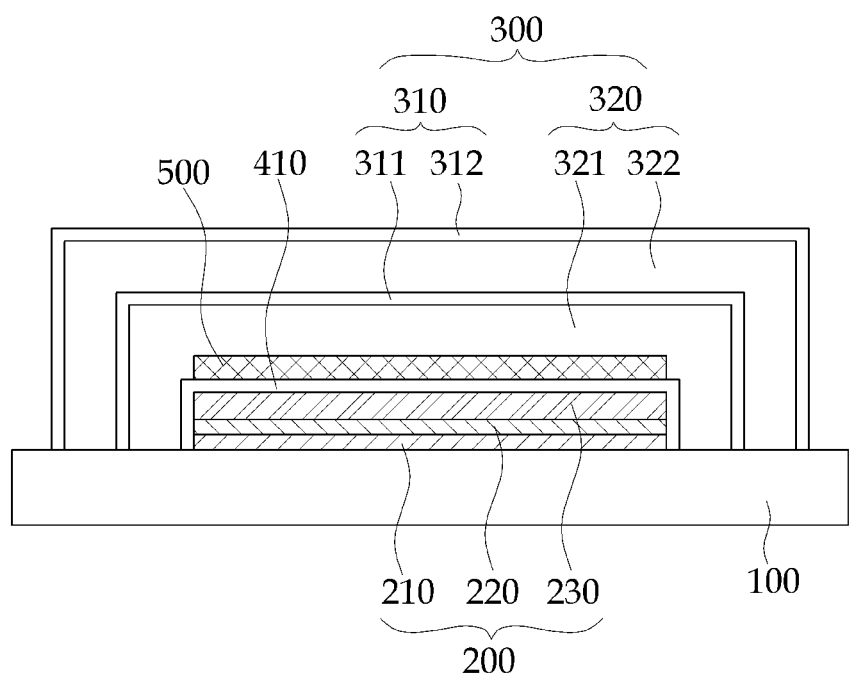
FIG. 4 is a diagram for describing a structure of an organic light emitting display device according to another embodiment of the present disclosure.

FIG. 4 illustrates a structure of an organic light emitting display device according to another embodiment of the present disclosure. In the organic light emitting display device illustrated in FIG. 4, an inorganic layer 410 is formed after forming the display unit 200, the light extraction reduction preventing layer 500 is disposed on the inorganic layer 410, and the encapsulation layer 300 is disposed thereon. Here, the inorganic layer 410 may correspond to the capping layer 400 of FIG. 3. The inorganic layer 410 may be formed with the same material used in the inorganic layer 310 of the encapsulation layer 300 by the same method applied in the formation of the inorganic layer 310. That is, the inorganic layer 410 may also correspond to the inorganic layer 310 of the encapsulation layer 300.

Figure 5:
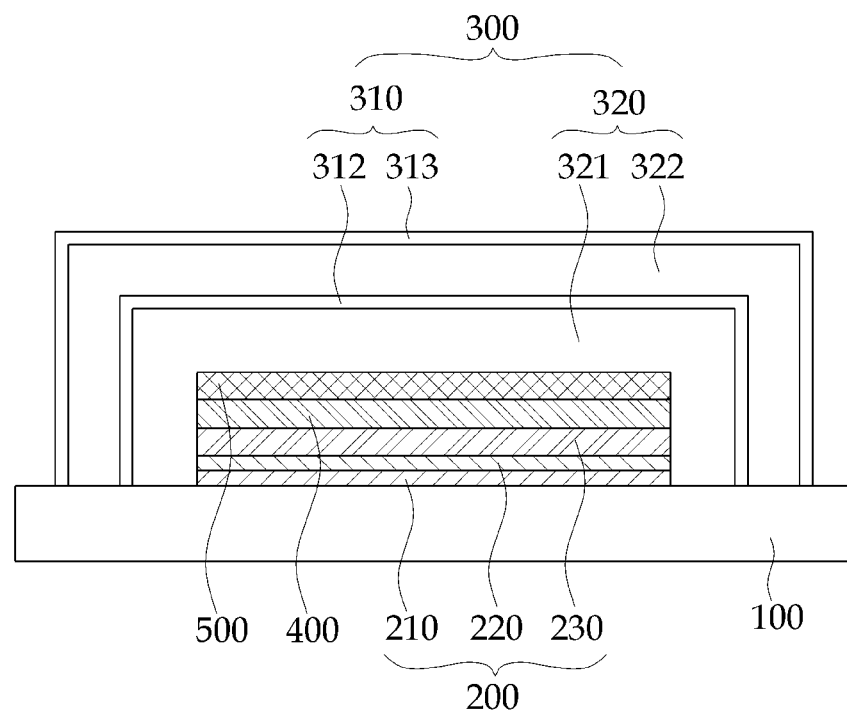
FIG. 5 is a diagram for describing a structure of an organic light emitting display device according to yet another embodiment of the present disclosure.

FIG. 5 illustrates a structure of an organic light emitting display device according to yet another embodiment of the present disclosure. Here, as illustrated in FIG. 3, the encapsulation layer 300 is formed after the capping layer 400 and the light extraction reduction preventing layer 500 are formed on the display unit 200, and the organic layer 320 is first formed when the encapsulation layer 300 is formed.

Further, another embodiment of the present disclosure provides a manufacturing method of an organic light emitting display device.

The manufacturing method of an organic light emitting display device may include forming a display unit 200 on a substrate, forming a light extraction reduction preventing layer 500 on the display unit 200, and forming an encapsulation layer 300 on the light extraction reduction preventing layer 500.

Here, the manufacturing method of an organic light emitting display device may further include forming a capping layer 400 before the step of forming of the light extraction reduction preventing layer 500 and after the forming of the display unit 200.

The forming of the encapsulation layer 300 may further comprise laminating at least one inorganic layer 310 and laminating at least one organic layer 320, one of the sequence of laminating an inorganic layer 310 and then laminating an organic layer 320 and the sequence of laminating an organic layer 320 and then laminating an inorganic layer 310 being repeated one or more times.

Hereinafter, the structure of the organic light emitting display device according to an embodiment of the present disclosure and a manufacturing method thereof will be described in more detail with reference to FIG. 6.

Figure 6:
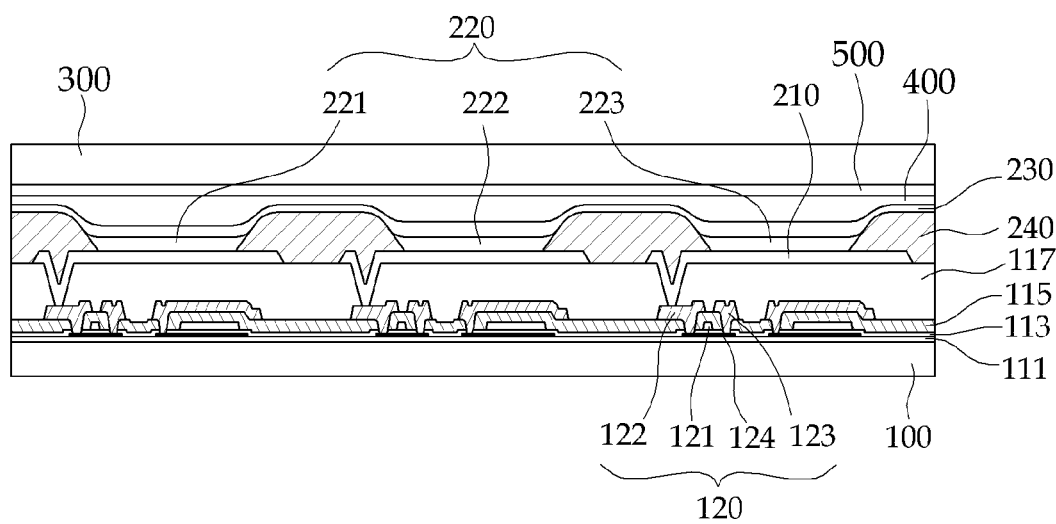
FIG. 6 is a cross-sectional view illustrating the structure of the organic light emitting display device in more detail according to an embodiment of the present disclosure.

In the organic light emitting display device illustrated in FIG. 6, the substrate 100 may be made of glass or polymer plastic which is generally used in organic light emitting display devices. The substrate 100 may be transparent or may not be transparent.

The first electrode 210 is disposed on the substrate 100.

As illustrated in FIG. 6, a plurality of thin film transistors 120 may be formed on the substrate 100 before forming the first electrode 210. The thin film transistor 120 includes a gate electrode 121, a drain electrode 122, a source electrode 123, and a semiconductor layer 124, which are formed on the substrate 100. Further, a gate insulating layer 113 and an interlayer insulating layer 115 are provided on the thin film transistor 120. The structure of the thin film transistor 120 is not limited to the form illustrated in FIG. 6 and may be configured by another form. A buffer layer 111 made of silicon oxide or silicon nitride may be further included between the thin film transistor 120 and the substrate 100, if necessary.

A first electrode 210, an emission layer 220, and a second electrode 230 are sequentially formed above the thin film transistors 120. The first electrode 210, the emission layer 220, and the second electrode 230 form the display unit 200. Here, the first electrode 210 is an anode as a pixel electrode which is electrically connected to the thin film transistor 120, and the second electrode 230 is a cathode.

The first electrode 210 is electrically connected with a lower thin film transistor 120. In this case, when a planarization layer 117 covering the thin film transistor 120 is provided, the first electrode 210 is disposed on the planarization layer 117, and the first electrode 210 is electrically connected to the thin film transistor 120 through a contact hole provided in the planarization layer 117.

The first electrode 210 may be provided as a transparent electrode or a reflective electrode. In the case where the first electrode 210 is provided as the transparent electrode, the first electrode 210 may be made of indium tin oxide (ITO), indium zinc oxide (IZO), ZnO or $In_2O_3$, and in the case where the first electrode 210 is provided as the reflective electrode, the first electrode 210 may include a reflective layer made of one of Ag, Mg, Al, Pt, Pd, Au, Ni, Nd, Ir, Cr, and a compound thereof and a layer made of ITO, IZO, ZnO or $In_2O_3$ thereon. In the case where the first electrode 210 is the anode, as a material of the first electrode 210, ITO may be a preferred choice.

In FIG. 6, it is exemplified that the first electrode 210 serves as an anode and the second electrode 230 serves as a cathode, but polarities of the first electrode 210 and the second electrode 230 may be reversed.

A pixel defining layer (PDL) 240 may be provided between the first electrodes 210. The pixel defining layer 240 may be made of a material having an insulation property and may partition the first electrodes 210, electrically isolating the first electrode 210 of each pixel from those of other pixels. In detail, the pixel defining layer 240 may be disposed at an edge of the first electrode 210 to partition the first electrodes by forming pixel units and defining pixel areas.

The emission layer 220 may be provided between the first electrode 210 and the second electrode 230. That is, the emission layer 220 may be disposed in an opening on the first electrode 210, which may be partitioned from other pixels by the pixel defining layer 210. The emission layer 220 may include a red emission layer 221, a green emission layer 222, and a blue emission layer 223.

The emission layer 220 may be formed by various methods, and, for example, may be formed by a one of a deposition method and a transfer method using a transfer donor film.

At least one of a hole injection layer, a hole transport layer, an electron transport layer and an electron injection layer in addition to the emission layer 220 may be further provided between the first electrode 210 and the second electrode 230. The emission layer 220, together with any of or any combination of the hole injection layer, the hole transport layer, the electron transport layer, and the electron injection layer, are referred to collectively as an organic layer. The organic layer may be made of a low-molecular weight organic material or a high-molecular weight organic material.

Low molecular weight organic materials may be used for each of the hole injection layer, the hole transport layer, the emission layer, the electron transport layer, and the electron injection layer. The low-molecular organic materials may be laminated in a single or complex structure, and the applicable organic material includes copper phthalocyanine (CuPc), N,N'-Di(naphthalene-1-yl)-N,N'-diphenylbenzidine (NPB), tris(8-hydroxyquinolinato)aluminum (Alq3), and the like. A vacuum deposition and the like is performed by using a mask, and any of the light emission layer 220, the hole injection layer, the hole transport layer, the electron transport layer, and the electron injection layer may be formed by using the low-molecular weight organic material.

The high-molecular weight organic material may be used for each of a hole transport layer (HTL) and an emission layer (EML). In this case, the hole transport layer may be made of poly(3,4-ethylenedioxythiophene) (PEDOT), and the emission layer may be made of poly-phenylenevinylene (PPV)-based and polyfluorene-based high-molecular weight organic materials.

The second electrode 230 may be disposed on the emission layer 220 and the pixel defining layer 240. The second electrode 230 may be made of a material which is generally used in the art. The second electrode 230 may also be provided as a transparent electrode or a reflective electrode. When the second electrode 230 is provided as the transparent electrode, the second electrode 230 may include a layer made of one of Li, Ca, LiF/Ca, LiF/Al, Al, Mg and a compound thereof and a layer made of a material for forming a transparent electrode such as ITO, IZO, ZnO, or $In_2O_3$ thereon. When the second electrode 230 is provided as the reflective electrode, the second electrode 230 may be provided by depositing one of Li, Ca, LiF/Ca, LiF/Al, Al, Mg and a compound thereof. In the embodiment illustrated in FIG. 6, when a top emission type organic light emitting display device is described, the second electrode 230 may be manufactured as the transparent electrode. For example, the second electrode 230 may be formed by using LiF/Al.

The capping layer 400 may be formed on the second electrode 230. The capping layer may be made of a transparent material having an ultraviolet blocking characteristic to protect the display unit 200 including the first electrode 210, the emission layer 220, and the second electrode 230.

The light extraction reduction preventing layer 500 may be formed on the capping layer 400. The light extraction reduction preventing layer 500 is made of a low refractive index material, and while the light generated from the emission layer 220 is discharged to the outside, the light is suppressed from dissipating, thereby improving light emission efficiency.

The encapsulation layer 300 may be formed on the light extraction reduction preventing layer 500.

The capping layer 400, the light extraction reduction preventing layer 500, and the encapsulation layer 300 are described above in detail.

As described above, the present disclosure provides an organic light emitting display device that includes a substrate, a first electrode disposed on the substrate, an emission layer disposed on the first electrode, a second electrode disposed on the emission layer, a capping layer disposed on the second electrode, a light extraction reduction preventing layer disposed on the capping layer, and an encapsulation layer disposed on the light extraction reduction preventing layer, in which a refractive index of the light extraction reduction preventing layer is lower than a refractive index of the capping layer and lower than a refractive index of the encapsulation layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting display device, comprising:
a substrate;
a first electrode disposed on the substrate;
an emission layer disposed on the first electrode;
a second electrode formed on the emission layer;
a first organic layer disposed on the second electrode;
a first inorganic layer disposed on the first organic layer; and
at least one second organic layer and at least one second inorganic layer disposed on the first inorganic layer,
wherein:
in a cross-sectional view, an area covered by at least one of the first organic layer and the first inorganic layer is smaller than an area covered by each of the at least one second organic layer and the at least one second inorganic layer;
a refractive index of the first inorganic layer is lower than a refractive index of the first organic layer; and
in the cross-sectional view, the first inorganic layer is contacted by at least one of the at least one second organic layer and the at least one second inorganic layer.

2. The organic light emitting display device of claim 1, wherein a refractive index of the first inorganic layer is in a range from about 1.1 to about 1.5.

3. The organic light emitting display device of claim 1, wherein a refractive index of the organic layer is in a range from about 1.6 to about 3.0.

4. The organic light emitting display device of claim 1, wherein a refractive index of the at least one second organic layer and the at least one second inorganic layer is in a range from about 1.5 to about 2.0.

5. The organic light emitting display device of claim 1, wherein the first organic layer comprising at least one of tris(8-hydroxyquinolinato)aluminum (Alq3), ZnSe, 2,5-bis(6'-(2',2''-bipyridyl))-1,1-dimethyl-3,4-diphenylsilole, 4,4'-bis[N-(1-naphthyl)-N-phenyl-amino]biphenyl (α-NPD), N,N-diphenyl-N,N-bis(3-methylphenyl)-1,1'-biphenyl-4,4'-diamine (TPD), and 1,1'-bis[di-(4-tolylamino)phenyl]cyclohexane (TAPC).

6. The organic light emitting display device of claim 1, wherein the first inorganic layer comprises at least one of $CaF_2$, NaF, $Na_3AlF_6$, $SiO_x$, $AlF_3$, LiF, $MgF_2$, and $IF_3$.

7. The organic light emitting display device of claim 1, wherein a thickness of the first inorganic layer comprising is from about 20 nm to about 200 nm.

8. The organic light emitting display device of claim 1, wherein at least one of the first organic layer and the first inorganic layer is contacted by the at least one second inorganic layer and spaced apart from the at least one second organic layer.

9. The organic light emitting display device of claim 1, wherein the first inorganic layer is covered and contacted by the first organic layer and the at least one second inorganic layer.

10. The organic light emitting display device of claim 1, wherein the first inorganic layer is entirely covered and contacted by the first organic layer and the at least one second inorganic layer.

11. The organic light emitting display device of claim 1, wherein at least one of the first organic layer and the first inorganic layer is spaced apart from the substrate.

* * * * *